United States Patent
Yoshikawa et al.

(10) Patent No.: US 7,920,361 B2
(45) Date of Patent: Apr. 5, 2011

(54) MAGNETORESISTIVE EFFECT ELEMENT WITH INTERMEDIATE OXIDE LAYER CONTAINING BORON AND AN ELEMENT SELECTED FROM CA, MG, SR, BA, TI, AND SC

(75) Inventors: Masatoshi Yoshikawa, Yokohama (JP); Tadashi Kai, Tokyo (JP); Toshihiko Nagase, Sagamihara (JP); Eiji Kitagawa, Sagamihara (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 850 days.

(21) Appl. No.: 11/844,069

(22) Filed: Aug. 23, 2007

(65) Prior Publication Data

US 2008/0291585 A1 Nov. 27, 2008

(30) Foreign Application Priority Data

Sep. 28, 2006 (JP) .................................. 2006-265201

(51) Int. Cl.
*G11B 5/39* (2006.01)
(52) U.S. Cl. .................................................. 360/324.1
(58) Field of Classification Search ............... 360/324.1, 360/324.11, 324.12, 324.2
See application file for complete search history.

(56) References Cited

U.S. PATENT DOCUMENTS

| | | | |
|---|---|---|---|
| 6,256,223 B1 | 7/2001 | Sun | |
| 6,338,899 B1 | 1/2002 | Fukuzawa et al. | |
| 6,347,049 B1 * | 2/2002 | Childress et al. | 365/173 |
| 6,661,625 B1 * | 12/2003 | Sin et al. | 360/324.2 |
| 6,754,053 B2 | 6/2004 | Yoshikawa et al. | |
| 6,784,509 B2 | 8/2004 | Yuasa et al. | |
| 6,905,780 B2 | 6/2005 | Yuasa et al. | |
| 6,937,446 B2 | 8/2005 | Kamiguchi et al. | |
| 7,038,893 B2 | 5/2006 | Koui et al. | |
| 7,046,489 B2 | 5/2006 | Kamiguchi et al. | |
| 7,071,522 B2 | 7/2006 | Yuasa et al. | |
| 7,072,153 B2 * | 7/2006 | Koui et al. | 360/324.1 |
| 7,116,529 B2 | 10/2006 | Yoshikawa et al. | |

(Continued)

FOREIGN PATENT DOCUMENTS

WO WO 2006/006420 A1 1/2006

OTHER PUBLICATIONS

U.S. Appl. No. 12/409,716, filed Mar. 24, 2009, Kitagawa, et al.

(Continued)

*Primary Examiner* — Jefferson Evans
(74) *Attorney, Agent, or Firm* — Oblon, Spivak, McClelland, Maier & Neustadt, L.L.P.

(57) ABSTRACT

It is made possible to provide a magnetoresistive effect element that can reverse magnetization direction with a low current, having low areal resistance (RA) and a high TMR ratio. A magnetoresistive effect element includes: a film stack that includes a magnetization free layer including a magnetic layer in which magnetization direction is changeable, a magnetization pinned layer including a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc. Current is applied bidirectionally between the magnetization pinned layer and the magnetization free layer through the intermediate layer, so that the magnetization of the magnetization free layer is reversible.

26 Claims, 7 Drawing Sheets

U.S. PATENT DOCUMENTS

| | | |
|---|---|---|
| 7,130,164 B2 | 10/2006 | Koui et al. |
| 7,145,754 B2 | 12/2006 | Koui et al. |
| 7,190,558 B2 | 3/2007 | Iwasaki et al |
| 7,196,877 B2 | 3/2007 | Yoshikawa et al. |
| 7,218,483 B2 | 5/2007 | Yuasa et al. |
| 7,223,485 B2 | 5/2007 | Yuasa et al. |
| 7,248,448 B2 | 7/2007 | Fukuzawa et al. |
| 2002/0048690 A1 | 4/2002 | Fukuzawa et al. |
| 2005/0167770 A1 | 8/2005 | Fukuzawa et al. |
| 2006/0067017 A1 | 3/2006 | Yuasa et al. |
| 2006/0071287 A1 | 4/2006 | Yuasa et al. |
| 2006/0164764 A1 | 7/2006 | Kamiguchi et al. |
| 2006/0181814 A1 | 8/2006 | Koui et al. |
| 2007/0014149 A1 | 1/2007 | Nagamine et al. |
| 2007/0086121 A1 | 4/2007 | Nagase et al. |
| 2007/0096229 A1 | 5/2007 | Yoshikawa et al. |
| 2007/0154740 A1 | 7/2007 | Yuasa et al. |
| 2007/0177310 A1 | 8/2007 | Yuasa et al. |

OTHER PUBLICATIONS

U.S. Appl. No. 12/409,654, filed Mar. 24, 2009, Yoshikawa, et al.

J.C. Slonczewski, "Current-driven excitation of magnetic multilayers", Journal of Magnetism and Magnetic Materials, N.H Elsevier, vol. 159, 1996, pp. L1-L7.

U.S. Appl. No. 11/832,203, filed Aug. 1, 2007, Kitagawa, et al.

U.S. Appl. No. 11/779,034, filed Jul. 17, 2007, Fukuzawa, et al.

U.S. Appl. No. 11/626,042, filed Jan. 23, 2007, Yoshikawa, et al.

\* cited by examiner

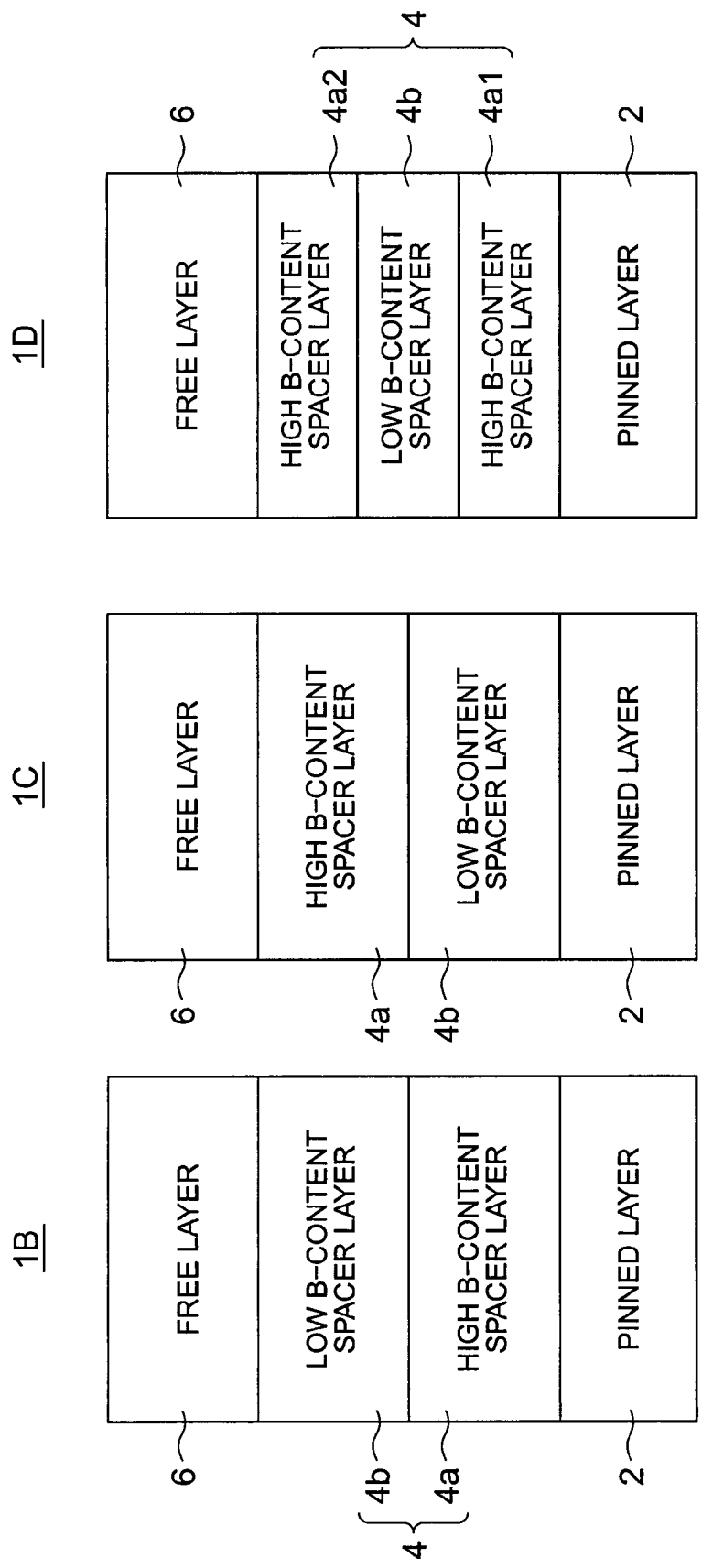

SELECT TRANSISTOR (CMOS)

SELECT TRANSISTOR (CMOS)

MAGNETORESISTIVE EFFECT ELEMENT WITH INTERMEDIATE OXIDE LAYER CONTAINING BORON AND AN ELEMENT SELECTED FROM CA, MG, SR, BA, TI, AND SC

CROSS-REFERENCE TO RELATED APPLICATION

This application is based upon and claims the benefit of priority from prior Japanese Patent Application No. 2006-265201 filed on Sep. 28, 2006 in Japan, the entire contents of which are incorporated herein by reference.

BACKGROUND OF THE INVENTION

1. Field of the Invention

The present invention relates to a magnetoresistive effect element and a magnetoresistive random access memory.

2. Related Art

In recent years, many kinds of solid-state memories for recording information based on new principles have been suggested. Among those memories, attention is currently drawn to magnetoresistive random access memories (hereinafter referred to also as MRAMs) as solid-state magnetic memories utilizing tunneling magnetoresistive effects (hereinafter referred to also as TMR effects). The MRAMs are characterized in storing data in accordance with the magnetization state of each MTJ (Magnetic Tunnel Junction) element.

In a MRAM of the above conventional type that performs writing in a current magnetic field (a magnetic field induced by a current flowing through a wiring line), when the size of each MTJ element is reduced, the coercive force Hc becomes larger, and the current required for writing tends to become higher accordingly. In the above conventional MRAM, it is impossible to reduce the cell size while maintaining a low current so as to achieve ultrahigh capacity exceeding 256 Mbits.

MRAMs utilizing a spin momentum transfer (SMT) writing method (hereinafter referred to as the spin-injection writing method) as the writing method to counter the above problem have been suggested (see U.S. Pat. No. 6,256,223, and C. Slonczewski, "Current-driven excitation of magnetic multilayers", JOURNAL OF MAGNETISM AND MAGNETIC MATERIALS, VOLUME 159, 1996, pp. L1-L7).

In a spin-injection magnetization reverse, the current Ic required for reversing magnetization is determined by the current density Jc. Accordingly, when the device area becomes smaller, the injection current IC required for reversing magnetization through spin injection also becomes lower. In a case where writing is performed at a constant current density, the writing current becomes lower when the size of the MTJ element becomes smaller, unlike in a MRAM of the conventional current-field writing method. Therefore, excellent scalability can be expected at least in principle.

In a tunneling magnetoresistive effect element of the spin-injection magnetization reversing type, an alloy containing Fe is normally used for the magnetization free layer or the reference magnetization layer. However, due to oxidization of Fe at the interface between the barrier layer and a magnetic layer (the magnetization free layer or the reference magnetization layer), the resistance R of the MTJ element becomes higher, and the current that can be applied becomes lower in a case where only a limited bias voltage can be applied. As a result, the current required for spin-injection writing cannot be supplied.

Furthermore, the TMR ratio required at the time of reading the barrier layer information becomes lower.

SUMMARY OF THE INVENTION

The present invention has been made in view of these circumstances, and an object thereof is to provide a magnetoresistive effect element of a spin-injection magnetization reversing type, and a magnetoresistive random access memory that can reverse magnetization with a low current, having low areal resistance (RA) and a high TMR ratio.

A magnetoresistive effect element according to a first aspect of the present invention includes: a film stack that includes a magnetization free layer including a magnetic layer in which magnetization direction is changeable, a magnetization pinned layer including a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc, wherein current is applied bidirectionally between the magnetization pinned layer and the magnetization free layer through the intermediate layer, so that the magnetization of the magnetization free layer is reversible.

A magnetoresistive random access memory according to a second aspect of the present invention includes: memory cells, each of the memory cells having the magnetoresistive effect element according to the first aspect as a memory element.

BRIEF DESCRIPTION OF THE DRAWINGS

FIGS. 3A through 3C are cross-sectional views of a MR element in accordance with second through fourth modifications of the first embodiment;

DETAILED DESCRIPTION OF THE INVENTION

The following is a description of embodiments of the present invention, with reference to the accompanying drawings.

First Embodiment

Figure 1:
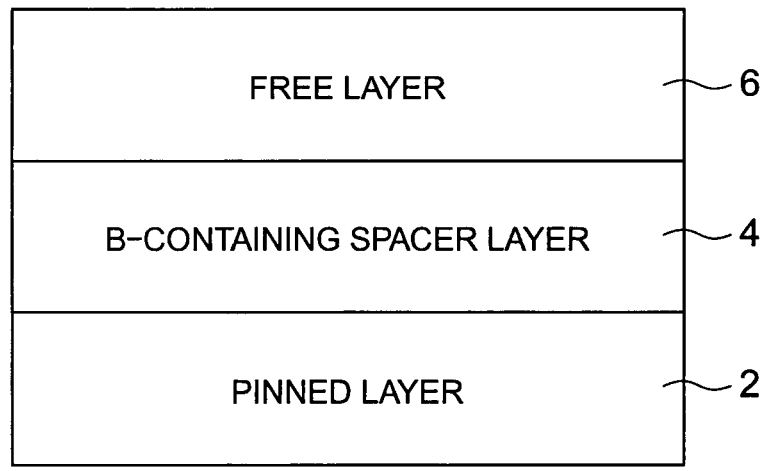
FIG. 1 is a cross-sectional view of a MR element in accordance with a first embodiment of the present invention.

FIG. 1 schematically shows the structure of a magnetoresistive effect element (hereinafter referred to also as a MR element) in accordance with a first embodiment of the present invention. The MR element 1 of this embodiment includes a magnetization pinned layer (hereinafter referred to also as a pinned layer) 2 that has a magnetic layer in which a magnetization direction is pinned, a magnetization free layer (hereinafter referred to also as a free layer) 6 that has a magnetic layer in which a magnetization direction is changeable, and a boron-containing spacer layer (an intermediate layer) 4 that is interposed between the pinned layer 2 and the free layer 6 and contains boron (B). The film stack of the pinned layer 2, the boron-containing spacer layer 4, and the free layer 6 is also called a magnetoresistive film (MR film). FIG. 1 shows only a schematic view of the MR element, and the MR element of this embodiment also includes a under layer, an antiferromagnetic layer that pins the magnetization direction of the pinned layer, and a cap layer. A pinned layer is also called a reference magnetization layer, and a free is also called a recording layer.

The MR element 1 of this embodiment energizes bidirectionally in a direction perpendicular to the film face of the MR film, so as to reverse the magnetization of the free layer 6. By doing so, the MR element 1 performs information recording. More specifically, the angular momentum of the spins of the pinned layer 2 from the pinned layer 2 to the free layer 6 is shifted by the bidirectional current application, and the spin angular momentum is shifted to the spins of the free layer 6 in accordance with the spin angular momentum conversion law. As a result, the magnetization of the free layer 6 is reversed. The MR element 1 of this embodiment is used for spin injection writing.

Although the pinned layer 2, the spacer layer 4, and the free layer 6 are stacked in this order in FIG. 1, the stacking order may be reversed.

Three examples of stack structures of MR elements in accordance with this embodiment are as follows. Stack structures of in-plane magnetization films include:

(1) cap layer/free layer/spacer layer/pinned layer/antiferromagnetic layer/under layer//substrate (2) cap layer/free layer/spacer layer/synthetic antiferro pinned layer/antiferromagnetic layer/under layer//substrate (3) cap layer/antiferromagnetic layer/pinned layer/second spacer layer/free layer/first spacer layer/synthetic antiferro coupling pinned layer/antiferromagnetic layer/under layer//substrate Here, each slash "/" indicates that the layer before the slash "/" is the upper layer, and the layer following the slash "/" is the lower layer. Each double-slash "//" indicates that there may be an element or layer in between. A synthetic antiferro pinned layer has a stack structure formed with a magnetic layer, a non-magnetic layer, and a magnetic layer, and the magnetic layers sandwiching the non-magnetic layer are in an antiferromagnetic coupling state. The non-magnetic layer contains Ru, Os, Ir, or the like. The antiferromagnetic layers may contain PtMn, IrMn, NiMn, FeMn, RhMn, FeRh, or the like. The magnetic layers such as the pinned layers and the free layers may be formed with magnetic materials such as ferromagnetic materials, antiferromagnetic materials, ferrimagnetic materials, or the likes.

The above structure (3) of a MR element is called a dual-structure, with two pinned layers sandwiching spacer layers having a free layer interposed in between. In this case, the magnetic layers of the two pinned layers on the sides of the spacer layers are in an antiparallel magnetization state. The structure (3) is a dual structure having a pinned layer formed with a single-layer magnetic layer and a synthetic antiferro coupling pinned layer. However, it is possible to form a dual structure having two synthetic antiferro coupling pinned layers. In such a case, the number of magnetic layers in one of the synthetic antiferro coupling pinned layers needs to be an odd number, while the number of magnetic layers in the other one of the synthetic antiferro coupling pinned layers needs to be an even number. With this arrangement, the magnetic layers of the two pinned layers on the spacer layer sides can be put into an antiparallel magnetization state through annealing in a unidirectional magnetic field. The first spacer layer and the second spacer layer are designed to have such film thicknesses that the MR ratios (magnetoresistive ratios) of the upper MR unit and the lower MR unit do not become equal to each other.

Figure 2:
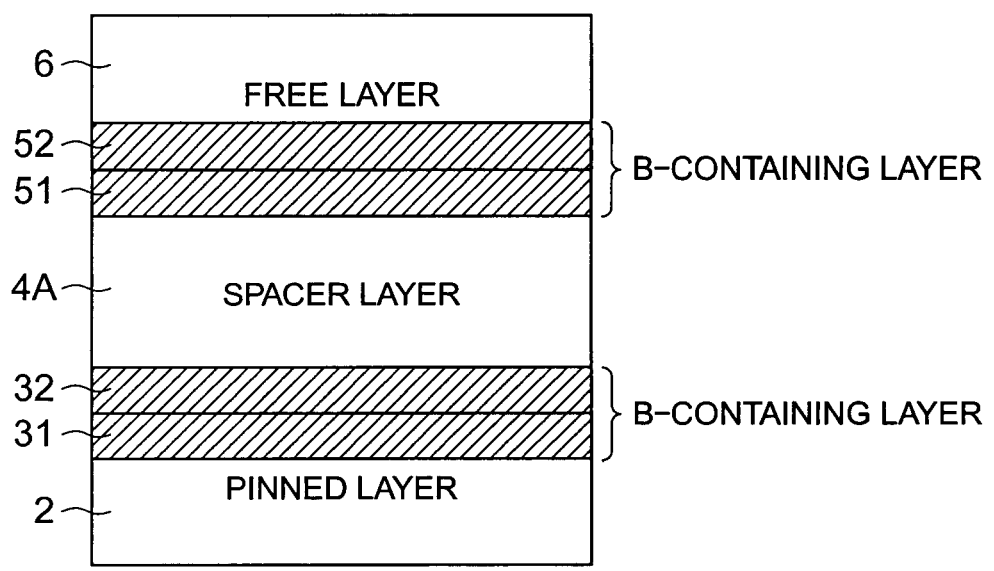
FIG. 2 is a cross-sectional view of a MR element in accordance with a first modification of the first embodiment.

FIG. 2 schematically shows the structure of a MR element in accordance with a first modification of this embodiment. The MR element 1A of this modification includes not only a pinned layer 2, a spacer layer 4A, a free layer 6, but also a boron-containing layer 31 provided on the side of the pinned layer 2 and in the vicinity of the interface between the pinned layer 2 and the spacer layer 4A, a boron-containing layer 32 provided on the side of the spacer layer 4A, a boron-containing layer 51 provided on the side of the spacer layer 4A and in the vicinity of the interface between the spacer layer 4A and the free layer 6, and a boron-containing layer 52 provided on the side of the free layer 6. Those boron-containing layers 31, 32, 51, and 52 are interfacial layers that may be formed at the time of film formation, or may be formed through heat treatment or the like carried out after the structure including the boron-containing spacer layer 4 shown in FIG. 1 is formed.

The boron-containing layers (interfacial layers) shown in FIG. 2 are not necessarily formed on and under the spacer layer 4A, and boron-containing layers formed only on one side of the spacer layer 4A are effective. However, in most cases, it is preferable to form boron-containing layers at the interface on the side of the under layer of the spacer layer 4A. Therefore, with the film forming order being taken into consideration, it is often preferable to form boron-containing layers at the interfaces with the magnetic layers prior to the formation of the spacer layer 4A.

FIGS. 3A through 3C schematically show the structures of MR elements in accordance with second through fourth modifications of this embodiment. The MR element 1B of the second modification is the same as the MR element 1 of the first embodiment shown in FIG. 1, except that the boron-containing spacer layer 4 has a film stack formed with a high boron-content spacer layer 4$a$ with a high boron content and a low boron-content spacer layer 4$b$ with a low boron content. The high boron-content spacer layer 4$a$ is formed on the side of the pinned layer 2, and the low boron-content spacer layer 4$b$ is formed on the side of the free layer 6. The MR element 1C of the third modification is the same as the MR element 1B of the second modification, except that the high boron-content spacer layer 4$a$ and the low boron-content spacer layer 4$b$ are stacked in reverse order. The MR element 1D of the fourth modification is the same as the MR element 1 of this embodiment shown in FIG. 1, except that the boron-containing spacer layer 4 has a low boron-content spacer layer 4$b$ interposed between two high boron-content spacer layers 4$a$1 and 4$a$2.

The second through fourth modifications shown in FIGS. 3A through 3C have layer structures in which the compositional gradient of the boron concentration is provided in the spacer layers at the time of film formation. The boron-containing spacer layer 4A shown in FIG. 2 is a XBO oxide containing boron. Here, X represents one of the elements of Ca, Mg, Sr, Ba, Ti, and Sc. In this case, boron does not necessarily exist as an oxide, but may exist as a solid solution inside the lattice of the XO oxide forming a NaCl structure. In a case where boron separates out or is segregated at the crystal grain boundary of the XO oxide, part of the boron exists as a boron oxide such as $B_2O$, BO, or $B_2O_3$, and those boron oxides are univalent, bivalent, and trivalent, respectively.

Figures 4A, 4B, 4C:
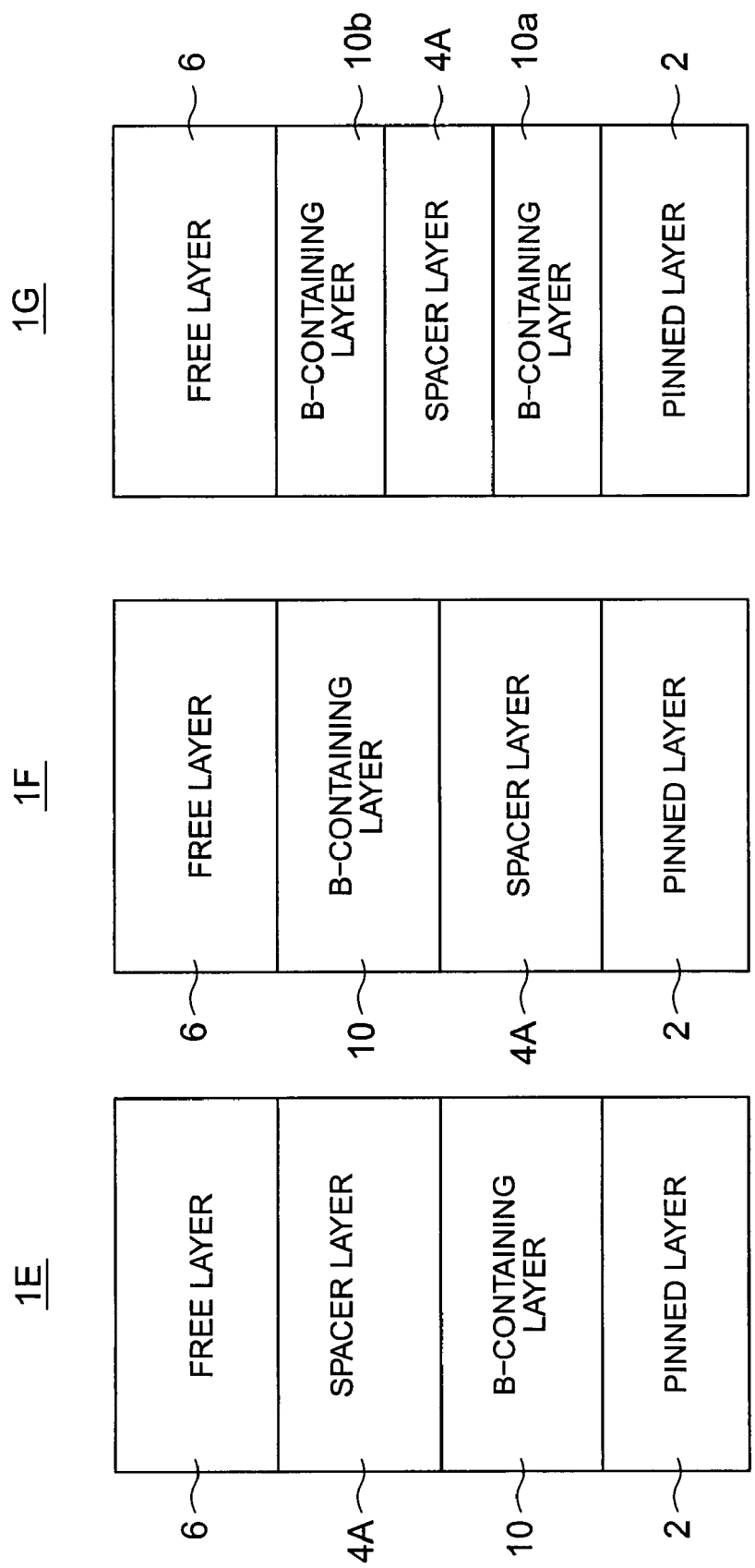
FIGS. 4A through 4C are cross-sectional views of a MR element in accordance with fifth through seventh modifications of the first embodiment.

FIGS. 4A through 4C schematically show the structures of MR elements in accordance with fifth through seventh modifications of this embodiment. The MR element 1E of the fifth modification is the same as the MR element 1 of the first embodiment shown in FIG. 1, except that the boron-containing spacer layer 4 has a film stack formed with a boron-containing layer 10 and a spacer layer 4A. The boron-containing layer 10 is formed on the side of the pinned layer 2, and the spacer layer 4A is formed on the side of the free layer 6. The MR element 1F of the sixth modification is the same as the MR element 1F of the fifth modification, except that the boron-containing layer 10 and the spacer layer 4A are stacked in reverse order. The MR element 1G of the seventh modification is the same as the MR element 1 of this embodiment shown in FIG. 1, except that the boron-containing spacer layer 4 has a spacer layer 4A interposed between two boron-containing layers 10a and 10b. Each of the stack structures shown in FIGS. 4A through 4C has a boron-containing layer or boron-containing layers at the interface(s) between the spacer layer and the free layer and/or the pinned layer. The boron-containing layers 10, 10a, and 10b may be formed with amorphous MgB alloys or $Mg_2B$ compounds, for example. Alternatively, those boron-containing layers may be boron single-element films. Those films are formed by RF sputtering or the like at the time of film formation. The boron-containing layers 10, 10a, and 10b are not necessarily non-magnetic layer, and may be magnetic layers. The boron-containing layers 10, 10a, and 10b have the effect of restraining oxidization of the magnetic element such as Co, Fe, Ni, or Mn existing at the interfaces with the free layer 6 and the pinned layer 2. The combination of the high boron-content spacer layer and the low boron-content spacer layer shown in FIGS. 3A through 3C may be used as the spacer layer 4A shown in FIGS. 4A through 4C.

Next, a tunneling magnetoresistive effect film (hereinafter referred to as a TMR film or a MTJ film) having a spacer layer as a tunnel barrier containing a boron-containing oxide of Ca, Mg, Sr, Ba, Ti, or Sc (hereinafter referred to as the element X) is described. In this embodiment, an oxide of the element X is coupled with a bivalent oxygen to form an XO oxide having a NaCl-type crystalline structure.

The oxide of the element X also has a body centered cubic (BCC) structure. On a magnetic layer formed with a FeCoNi alloy having a (100) plane priority orientation, the XO oxide is formed with a (100) plane priority orientation by epitaxial growth method. A magnetic layer with a BCC structure having a (100) plane priority orientation has a small misfit at the interface between the spacer layer and the free layer, if the orientational relationship is as follows:

$(100)_{spacer\ layer}//(100)_{free\ layer}$ $[100]_{spacer\ layer}//[110]_{free\ layer}$ Here, the crystallinity of the initial layer or the initial defect layer is improved, and an excellent spacer layer with a (100) plane priority orientation can be obtained.

Normally, the above oxide of the element X grows with a (100) plane priority orientation on a magnetic layer formed with a FeCoNi alloy having an amorphous structure. The amorphous FeCoNi alloy in such a case should be an alloy that is expressed by the composition formula: $(Fe_{1-x-y}Co_xNi_y)_{100-a}Z_a$ ($0 \leq x \leq 1$, $0 \leq y \leq 1$, Z being an element selected from the group consisting of C, N, B, and P, $10 \leq a$ (at %)). To obtain a thermally stable amorphous FeCoNi alloy, it is preferable to add a metalloid element such as Si, Ge, or Ga to an alloy expressed by the above composition formula.

A "(100) plane priority orientation" of the oxide of the element X refers to a (100) peak rocking curve that is caused by the (100) plane reflection in an X-ray diffraction pattern and has a half width of 10 degrees or less, more preferably, 5 degrees or less. The (100) peak can be observed if a XO oxide of 5 nm or more in film thickness is formed on a predetermined magnetic layer under the conditions for forming a MgO layer. In an actual element, the film thickness of the XO oxide is very small, and therefore, measurement is carried out based on a diffraction image obtained through an inverse Fourier transformation of a lattice image generated from a cross-sectional TEM image. This diffraction image corresponds to a local diffraction pattern. In such a case, the intensity profile of the (100) diffraction spots is measured, and the half width in the radial direction with respect to a (100) diffraction spot centering on the direct spot should be 10 degrees or less.

In a case where a film formation technique such as a sputtering technique is utilized, a mixing layer is of course formed at the interface between the spacer layer formed with an oxide of the element X and the free layer or the pinned layer. Therefore, Fe, Co, and Ni can easily be coupled with the oxygen in the spacer layer, and readily form oxides such as $Fe_2O_3$, FeO, NiO, $Co_2O_3$, and CoO through the temperature history during the annealing process for the magnetization pinned layer of the MR film or the formation of the MR element. The oxides add as an existing resistance in series to the resistance of the MR element. As a result, the MR ratio becomes lower. At the same time, the areal resistance RA becomes higher. Here, the areal resistance RA is the resistance normalized by area, and is often used for applying current perpendicular to a film plane where the resistance R that varies with area. The unit that is generally used for areal resistance is $[\Omega\mu m^2]$.

To counter the above problem, boron is added to the spacer layers used in the MR elements of this embodiment and its modifications. With this arrangement, oxidization of Fe, Co, and Ni at the interface between a spacer layer and a pinned layer or at the interface between a free layer and a spacer layer can be restrained. Particularly, oxidization of Fe is strongly restrained. In this case, in the vicinity of each interface, boron is preferentially oxidized to form $B_2O_3$, $B_2O$, and BO, though the oxidized boron mostly forms $B_2O_3$.

In each MR element of this embodiment, the amount of boron in the spacer layer is 20 at % or less. If the addition of boron exceeds 20 at %, the electric conduction characteristics of the spacer layer of this embodiment do not exhibit tunneling conduction characteristics, and the MR ratio becomes lower.

In each MR element of this embodiment, the boron contained in the spacer layer exhibits high concentration at the interface between the free layer or the pinned layer and the spacer layer, or in the vicinity of the interface. The concentration distribution can be controlled by adjusting the amount of boron to be added to the spacer layer and suitably selecting the adding method.

Boron is added to a spacer layer by injecting boron into the target in advance or by simultaneously forming boron and a spacer layer material from two sources (a dual cosputtering method or the like).

In this embodiment, the B element is contained in each spacer layer as shown in the drawings. The concentration of the contained boron is closely related to the crystallinity of the spacer layer. A thickness of the spacer layer is preferably 0.5 nm or more to 5 nm or less. In a case where the thickness of the spacer layer is less than 0.5 nm, the spacer layer is not a continuous layer. In a case where the thickness of the spacer layer is more than 5 nm, MR ratio is almost saturated. Practically, the thickness of the spacer layer is more preferably 1.0 nm or more to 2 nm or less.

The formation of a boron-containing spacer layer may be carried out by:

a) a RF sputtering technique, using a XBO oxide target containing boron b) a reactive DC (RF) sputtering technique, using a XB metal target containing boron in oxygen atmosphere c) a dual DC (RF) cosputtering technique, using a XO oxide target and a boron target Here, the element X is Ca, Mg, Sr, Ba, Ti, or Sc.

The above described segregation state of boron can be achieved by inserting a boron layer or a boron-containing spacer layer in the interface between a spacer layer and a free layer or in the interface between the spacer layer and a pinned layer, as shown in FIG. 2. The boron-containing spacer layer may be a MgB layer or a MgBO layer. A MgB alloy has an amorphous structure or a HCP structure, and MgBO has a NaCl structure.

The boron-containing spacer layer is inserted between the spacer layer and the pinned layer or between the spacer layer and the free layer, and, after the film formation, annealing is performed at an appropriate temperature. In this manner, the boron can be distributed in the spacer layer, while the high concentration is maintained in the vicinity of the interface. Thus, the same characteristics as those observed when boron is added to the spacer layer can be achieved.

Although the pinned layer is formed on the substrate side in the above embodiment, the free layer may be formed on the substrate side, to achieve the same effects as above.

EXAMPLES

Next, specific examples are described.

First, to achieve a low areal resistance RA and a high TMR ratio, a first TMR film with the following film structure was formed with a DC/RF magnetron sputtering device.

First TMR film: $Ta(5)/Co_{50}Fe_{50}(3)/MgO(0.75)/Co_{50}Fe_{50}(3)/Ru(0.85)/Co_{90}Fe_{10}(3)/PtMn(15)/Ta(5)//$substrate Here, the number in each of the brackets indicates a film thickness (nm).

This was formed into an element, and the areal resistance RA and the TMR ratio were examined. The areal resistance RA was approximately 100 [$\Omega\mu m^2$], and the TMR ratio was 60 [%]. To actually reverse the spin injection magnetization, it is necessary to adjust the areal resistance RA to approximately 50 [$\Omega\mu m^2$], and therefore, the above element cannot be used as it is. To lower the areal resistance RA, the MgO layer as a tunnel barrier was made thinner. As a result, the MgO layer became a discontinuous film, the areal resistance RA dramatically decreased, and the TMR ratio deteriorated.

In the first TMR film, the interface portion between the tunnel barrier layer formed with MgO and the pinned layer formed with $Co_{50}Fe_{50}$ was examined. The structure of a second TMR film for XPS (X-ray Photoelectron Spectroscopy) measurement was: $MgO(0.85)/Co_{50}Fe_{50}(3)/Ru(0.85)/Co_{90}Fe_{10}(3)/PtMn(15)/Ta(5)//$substrate.

As a result of XPS measurement, Fe oxide peaks were clearly observed, and the oxides were determined to be FeO and $Fe_2O_3$. Accordingly, it can be considered that the areal resistance RA increased and the TMR ratio deteriorated due to the prioritized Fe oxidization at the interface between the tunnel barrier layer formed with MgO and the pinned layer formed with $Co_{50}Fe_{50}$.

Next, in a third TMR film having the following structure, the B concentration distribution was examined by SIMS (Secondary-Ion-Mass-Spectroscopy) analysis. The sample was annealed in vacuum and in a magnetic field at 350° C.

Figure 5:
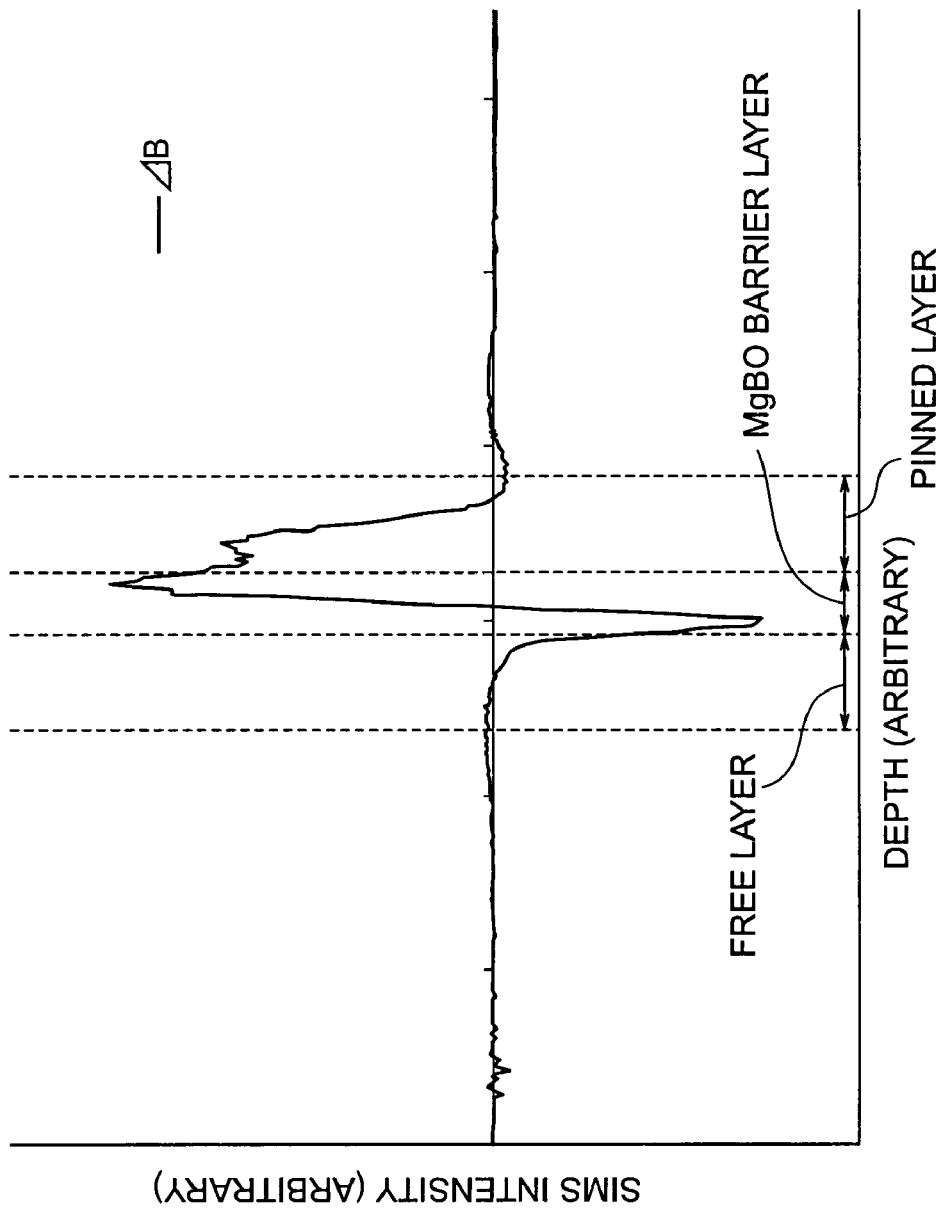
FIG. 5 shows the difference AB between the boron concentrations that are SIMS analysis results obtained before and after annealing of the MR film of the MR element of the first embodiment.

The third TMR film: $Ta(5)/Co_{40}Fe_{40}B_{20}(3)/MgO(0.75)/Co_{40}Fe_{40}B_{20}(3)/Ru(0.85)/Co_{50}Fe_{50}(3)/PtMn(15)/Ta(5)//$substrate FIG. 5 shows the difference ΔB between the boron concentrations as results of the SIMS analysis carried out before and after the annealing at 350° C. (the difference ΔB=the B concentration after the annealing−the B concentration before the annealing). Since the SIMS analysis carried out in this examination was not designed to determine a composition in terms of quantitation, the difference between before and after the annealing, and a qualitative approach was taken into consideration. However, in regular SIMS analysis, quantitative analysis can be carried out. In this case, boron was distributed largely at the interface between the pinned layer and the spacer layer, as can be seen from FIG. 5.

On the annealed sample, EDX (Energy Dispersive X-ray) analysis was also carried out with an analytical transmission electron microscope. The above described analysis was carried out on a cross-sectional transmission electron microscopy (TEM) image of the third TMR film. As a result, the existence of boron was not recognized, with the amount of boron being less than a detectable amount in the portion of $Co_{40}Fe_{40}B_{20}(3)/MgO(0.75)/Co_{40}Fe_{40}B_{20}(3)/Ru(0.85)/Co_{50}Fe_{50}(3)/PtMn(15)$ of the third TMR film. However, boron was observed in the Ta layers on and under that portion.

The areal resistances RA and the TMR ratios of the third TMR film were measured to obtain the following results.

| | RA ($\Omega\mu m^2$) | TMR (%) |
|---|---|---|
| Before annealing | 20 | 30 |
| After annealing | 15 | 215 |

As a result of evaluations performed on the areal resistances RA and the TMR ratios, a TMR film with a very low areal resistance RA and a high TMR ratio was obtained after the annealing.

A structural analysis revealed that the CoFeB layer had an amorphous structure before the annealing, but, after the annealing, almost all the region of the CoFeB layer was recrystallized to form a BCC structure. It was also observed that the recrystallized CoFeB layer had a prioritized orientation, so that the (100) plane was parallel to the film plane. This became apparent through a spot arrangement by a reverse Fourier transform of a nano ED (Electron Diffraction) from a cross-sectional TEM image or a lattice pattern observed by cross-sectional TEM.

An examination was further carried out to check how the above results were obtained. First, a fourth TMR film having the following structure was formed with a DC/RF magnetron sputtering device, and annealing was then performed at 350° C.

Figure 6:
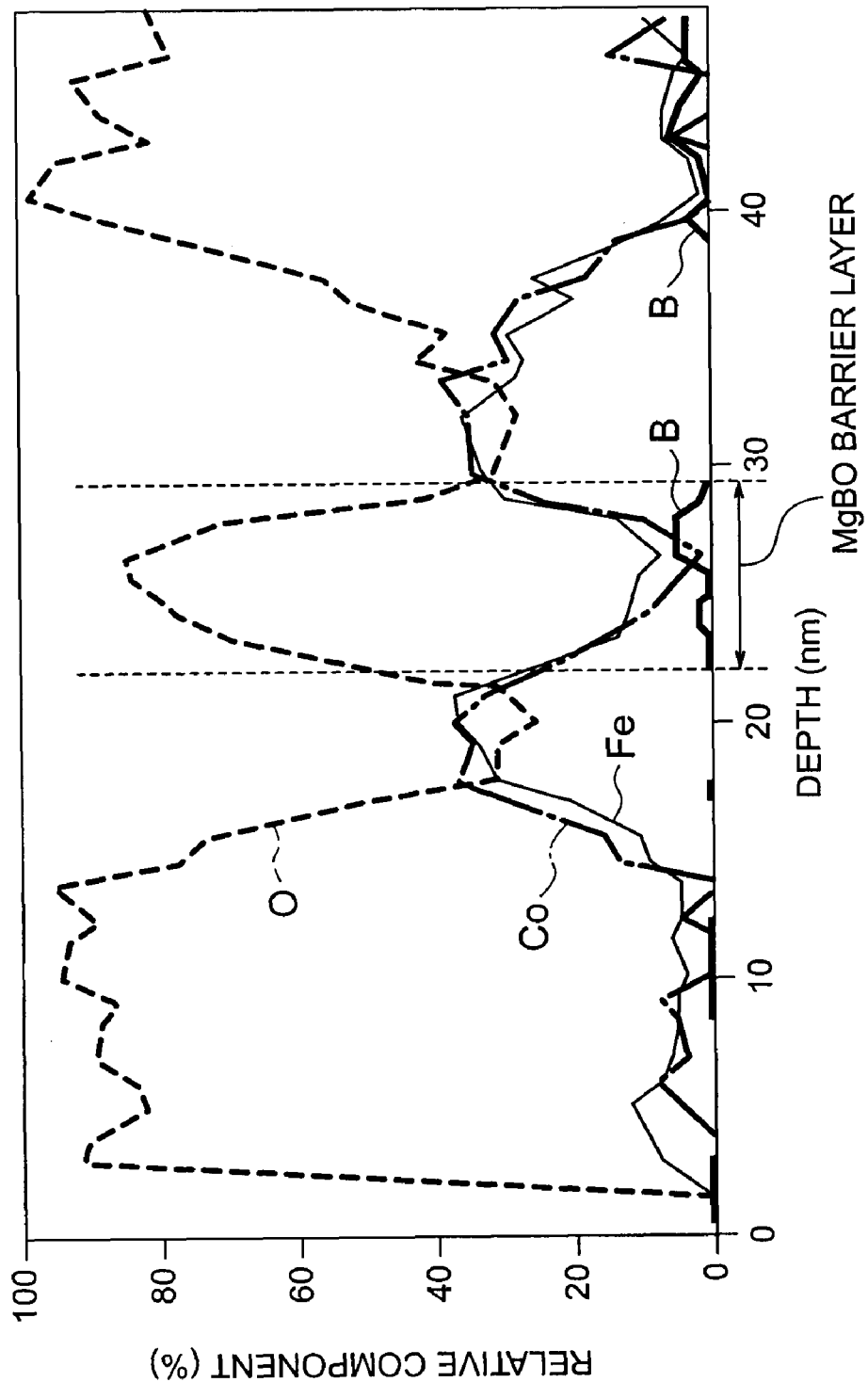
FIG. 6 shows the results of composition analysis by EELS method carried out on the MR film of the MR element of the first embodiment.

The fourth TMR film: $Ta(5)/Co_{40}Fe_{40}B_{20}(5)/MgO(5)/Co_{40}Fe_{40}B_{20}(5)/Ta(5)//$substrate As to the fourth TMR film, the boron concentration in the TMR film was examined in greater detail. The analysis method was carried out by EELS (Electron-Energy-Loss Spectroscopy) method with an analytical transmission electron microscope. By EELS method, the energy loss of transmission electrons was measured, and accordingly, not only the elemental abundance ratio analysis (composition analysis) but also the elemental state can be analyzed. FIG. 6 shows the results of the composition analysis by EELS method. As shown in FIG. 6, the existence of boron in the MgO spacer layer was clearly observed, and the boron concentration peak in the MgO spacer layer was shifted toward the interface with the CoFe layer closer to the substrate. In other words, an MgBO layer is formed in a region of the MgO spacer layer which is closer to the CoFe layer. As described above, by the EDX composition analysis, the existence of boron was observed in the upper and lower Ta films, but boron was not seen in any other layer. Therefore, the EELS method analysis was found to be very effective.

Through the above analysis, it was found that boron mostly existed at the interface between the MgO tunnel barrier layer (spacer layer) and the CoFe layer to be the under layer, and accordingly, the low areal resistance RA and the high TMR ratio were achieved.

With the above observations being taken into consideration, the following experiments were carried out. First, the formation of an element from a TMR film was examined. With the use of a DC/RF magnetron sputtering device, TMR films of Comparative Example 1 and Examples 1 through 4 were formed on substrate having lower wirings provided thereto, and annealing was performed in vacuum and in a magnetic field at 350° C. The structures of the respective TMR films are as follows. A thickness mentioned below of each layer of the TMR film is a value at the planning phase and can be different from a thickness of each layer of a manufactured TMR film.

Comparative Example 1

$Ta(5)/Co_{50}Fe_{50}(3)/MgO(0.75)/Co_{50}Fe_{50}(3)/Ru(0.85)/Co_{50}Fe_{50}(3)/PtMn(15)/Ta(5)//substrate$ Example 1

$Ta(5)/Co_{50}Fe_{50}(3)/MgBO(0.8)/Co_{50}Fe_{50}(3)/Ru(0.85)/Co_{50}Fe_{50}(3)/PtMn(15)/Ta(5)//substrate$ Example 2

$Ta(5)/Co_{50}Fe_{50}(3)/MgO(0.35)/MgBO(0.4)/Co_{50}Fe_{50}(3)/Ru(0.85)/Co_{50}Fe_{50}(3)/PtMn(15)/Ta(5)//substrate$ Example 3

$Ta(5)/Co_{50}Fe_{50}(3)/MgO(0.75)/B(0.4)/Co_{50}Fe_{50}(3)/Ru(0.85)/Co_{50}Fe_{50}(3)/PtMn(15)/Ta(5)//substrate$ Example 4

$Ta(5)/Co_{50}Fe_{50}(3)/MgO(0.7)/MgB(0.4)/Co_{50}Fe_{50}(3)/Ru(0.85)/Co_{50}Fe_{50}(3)/PtMn(15)/Ta(5)//substrate$ In Comparative Example 1, a MgO target was used for forming a tunnel barrier layer made of MgO.

In Examples 1 and 2, a cosputtering method using a MgO target and a B target was used for forming a tunnel barrier layer made of MgBO. The tunnel barrier layer made of MgBO can also be formed using a MgBO target. It is preferably that the tunnel barrier layer made of MgBO is formed using the cosputtering method. It is necessary to optimize an additive amount of boron in 1 at % to 20 at % corresponding to a condition of forming layers. In Example 1, it is necessary to optimize a boron concentration and a condition of forming layers so as to be boron-rich in a region of the tunnel barrier layer which is closer to a pinned layer made of CoFe being an underlying layer of the spacer layer by banking the boron concentration at the forming layers. A thickness of the MgBO layer in Example 2 is preferably 0.1 nm to 0.5 nm. In a case where the thickness of the MgBO layer is less than 0.1 nm, it is not possible to form layers precisely. In a case where the thickness of the MgBO layer is more than 0.5 nm, a possibility that an areal resistance RA increases is more higher.

In Example 3, a B target was used. A thickness of a boron layer is preferably 0.2 nm to 1 nm. In this case, as boron atoms intrude into an underlying layer of CoFe, a surface region in the underlying layer of CoFe is anticipated to be amorphous and the boron layer is also anticipated to be amorphous.

In Example 4, cosputtering was performed using a Mg target and a B target to form a MgB layer. It is necessary to optimize an additive amount of boron in 1 at % to 20 at % corresponding to a condition of forming layers. The MgB layer can also be formed using a MgB target. The MgB layer is anticipated to be amorphous. A thickness of the MgB layer is preferably 0.2 nm to 1 nm. In a case where the thickness of the MgB layer is less than 0.2 nm, an effect by inserting the MgB layer is hardly obtained. In a case where the thickness of the MgB layer is less than 1 nm, a MR ratio rapidly decrease.

In Examples 1 to 4, all samples are annealed at 350° C. After annealing, it is anticipated that an MgBO layer is formed at interface between the spacer layer and the pinned layer in each of all samples.

After that, the samples were processed into ellipsoids of 100 nm×200 nm by photolithography. The protection films and the interlayer films were formed, and flattening was performed by CMP (Chemical Mechanical Polishing) to expose the top of each TMR film and form contact portions. The upper wirings were formed on the contact portions. In this manner, MTJ elements for four-terminal measurement were formed.

The resistance R and the TMR ratio of each of the MTJ element were measured by method for applying a current in plane. Each TMR film was optimized in forming condition. In Comparative Example 1, the areal resistance RA was about 100 $\Omega\mu m^2$, the TMR ratio was about 105%. On the contrary, In Examples 1 to 4, the areal resistance RA was 10 $\Omega\mu m^2$ to 25 $\Omega\mu m^2$, the TMR ratio of each Example was about 200% to 215%.

Then, the resistance R and the TMR ratio of each of the MTJ element were measured by a four-terminal measurement method. The measurement results by both methods are almost the same and are as follows. The area A used for calculating the areal resistance RA was calculated via the ellipsoid approximation.

|  | RA ($\Omega\mu m^2$) | TMR (%) |
| --- | --- | --- |
| Comparative Example 1 | 100 | 105 |
| Example 1 | 25 | 200 |
| Example 2 | 20 | 210 |
| Example 3 | 10 | 200 |
| Example 4 | 15 | 215 |

Next, for each of the MTJ elements, a cross-sectional TEM sample was analyzed by EELS method. In Example 1, as a result of the EELS analysis carried out on the cross-sectional TEM, the boron concentration in the MgO layer was approximately 15 at %. Also, as a result of the EELS analysis, a boron-rich composition was observed in the MgBO layer on the side of the interface with the CoFe layer. Judging from the results, the segregation of boron toward the CoFe/MgO interface is considered to restrain oxidization of Fe and Co in the CoFe layer, and realize the low areal resistance RA and the high TMR ratio.

To analyze the interface between the MgO layer and the CoFeB pinned layer in greater detail, the following samples were produced.

(Sample 1)
  MgO(0.75)/$Co_{50}Fe_{50}$(3)/Ru(0.85)/$Co_{50}Fe_{50}$(3)/PtMn(15)/Ta(5)//substrate
(Sample 2)
  MgBO(0.8)/$Co_{50}Fe_{50}$(3)/Ru(0.85)/$Co_{50}Fe_{50}$(3)/PtMn(15)/Ta(5)//substrate
(Sample 3)
  MgO(0.35)/MgBO(0.4)/$Co_{50}Fe_{50}$(3)/Ru(0.85)/$Co_{50}Fe_{50}$(3)/PtMn(15)/Ta(5)//substrate
(Sample 4)
  MgO(0.75)/B(0.4)/$Co_{50}Fe_{50}$(3)/Ru(0.85)/$Co_{50}Fe_{50}$(3)/PtMn(15)/Ta(5)//substrate
(Sample 5)
  MgO(0.7)/MgB(0.4)/$Co_{50}Fe_{50}$(3)/Ru(0.85)/$Co_{50}Fe_{50}$(3)/PtMn(15)/Ta(5)//substrate In Sample 1, as a result of XPS analysis, an energy chemical shift indicating the existence of an oxidized phase of Fe at the interface between the MgO layer and the CoFe layer was observed, and the existence of Fe—O (a solid solution of Fe and O) and $Fe_2O_3$ was confirmed.

In Sample 2, peak clearly indicating the existence of oxidization of Fe or Co was not observed. However, peak formed by oxidization of boron near the interfaces was observed. The oxidized boron observed there were $B_2O_3$, BO, and $B_2O$, though the oxidized boron mostly formed $B_2O_3$. In Samples 3 to 5, the observed results are almost the same.

It became apparent from the above results that the addition of boron to the MgO layer restrained oxidization of Fe and Co at the interface between the MgO layer and the CoFe layer to be the under layer. Also, it became apparent that the segregation of the added boron at the interface between the MgO layer and the CoFe layer to be the under layer caused prioritized oxidization of boron at the interface, and thus restrained oxidization of Co and Fe at the interface. Lastly, it became clear that the segregation of boron at the interface between the MgO layer and the magnetic layer to be the under layer was essential.

As described above, in this embodiment, TMR films with low areal resistance RA and high TMR ratios can be obtained.

As a result of dielectric analysis by EELS method, the dielectric constant of the MgO layer was 2.7 or less. This is one of the features of an MgO layer containing boron. A tunnel barrier layer tends to have a lower breakdown voltage when the dielectric constant is lower. Since the dielectric constant of MgO single crystals is normally 7 to 9, the addition of boron greatly decreases the dielectric constant. Each TMR film of this embodiment has excellent breakdown voltage characteristics. When a 10-microsecond pulse voltage was applied, a withstand voltage close to 2 V was observed. This is a higher value than a breakdown voltage estimated from the dielectric constant of MgO, and is considered to be the effect of the boron addition to the MgO layer.

The same results as described above were obtained with CaO, SrO, BaO, TiO, and ScO, which showed similar tendencies.

It was also found that the barrier layer that has an amorphous structure and is formed with an oxide or nitride containing at least one element selected from the group consisting of Al Si, Hf, and Zr could also have low areal resistance in a case where boron was segregated at the interface as described above.

In this embodiment, the element added to the spacer layers should change the semiconduction characteristics, and lower the resistance. In this sense, C (carbon) or P (phosphorus) is also effective. However, B (boron) is the most effective in increasing the TMR ratio.

The contained boron can be detected by EELS method with an analytical transmission electron microscope. By EELS method, the energy loss in electrons that have traveled through substances is measured. Accordingly, even a very small amount of boron can be detected, and the coupling state of boron with another element can also be detected.

Each spacer layer is not necessarily an oxide. To achieve the same effects as the above effects of the element addition, a spacer layer may be an insulating material formed with a multiphase of an oxide and a nitride.

The oxide may be CaO, MgO, SrO, BaO, TiO, or ScO. The nitride may be TiN or the like.

A spacer layer formed with the above oxide or nitride has a NaCl-type crystalline structure. Here, only part of the spacer layer may have the NaCl-type structure.

More preferably, a spacer layer formed with the above oxide or nitride having the NaCl-type structure should have the (100) plane as the priority orientation plane. Here, the (100) plane as the priority orientation plane is parallel to the film plane.

Second Embodiment

Next, a spin-injection MRAM in accordance with a second embodiment of the present invention is described. This MRAM has memory cells arranged in a matrix fashion, and each of the memory cells has a MR element in accordance with the first embodiment or a modification of the first embodiment. A TMR film is used for the MR element.

Figure 7:
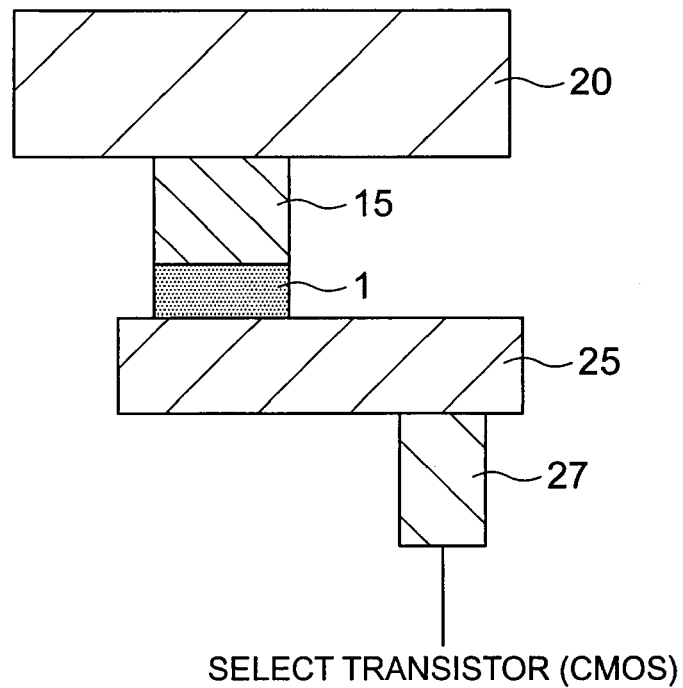
FIG. 7 is a cross-sectional view of an example of a memory cell of a spin-injection MRAM in accordance with a second embodiment of the present invention.
Figure 8:
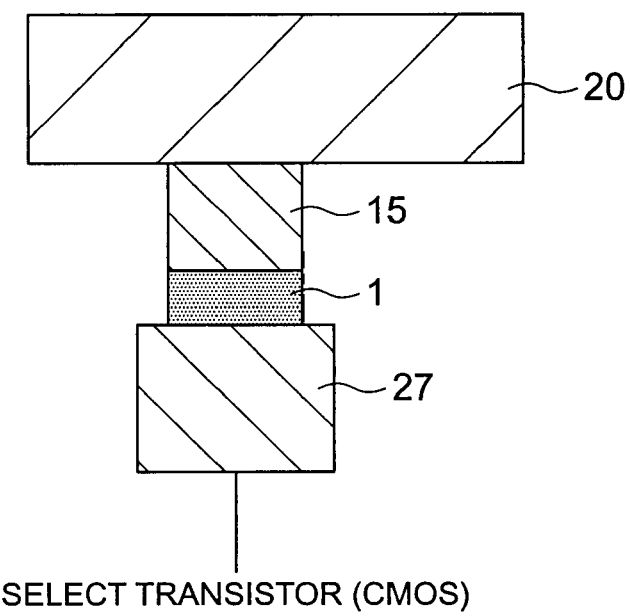
FIG. 8 is a cross-sectional view of another example of a memory cell of the spin-injection MRAM in accordance with the second embodiment.

FIGS. 7 and 8 show memory cells of spin-injection MRAMs of this embodiment. Each memory cell is formed on a CMOS select transistor formed on a Si substrate. Each select transistor is electrically connected to a MR element 1 through a via 27.

In the example case shown in FIG. 7, one terminal of the MR element 1 is electrically connected to the via 27 through an extension electrode 25. In the example case shown in FIG. 8, one of the terminals of the MR element 1 is connected directly to the via 27. The other terminal of each MR element 1 is connected to a bit line 20 via a hard mask 15.

In the case shown in FIG. 8, the MR element 1 is formed immediately on the via 27, and therefore, the size of the MR element 1 should preferably be smaller than the size of the via 27. While the minimum cell size in the layout shown in FIG. 7 is $8 F^2$, the minimum cell size in the layout shown in FIG. 8 can be made as small as $4 F^2$. Here, "F" represents the smallest process size.

The metal wiring layer of each layer and the via may be made of W, Al, AlCu, or Cu. In a case where Cu is used for the metal wiring layer and the via, a Cu damascene or Cu dual damascene process is used. In the formation of each MR element 1, the bit line is formed lastly.

Figure 9:
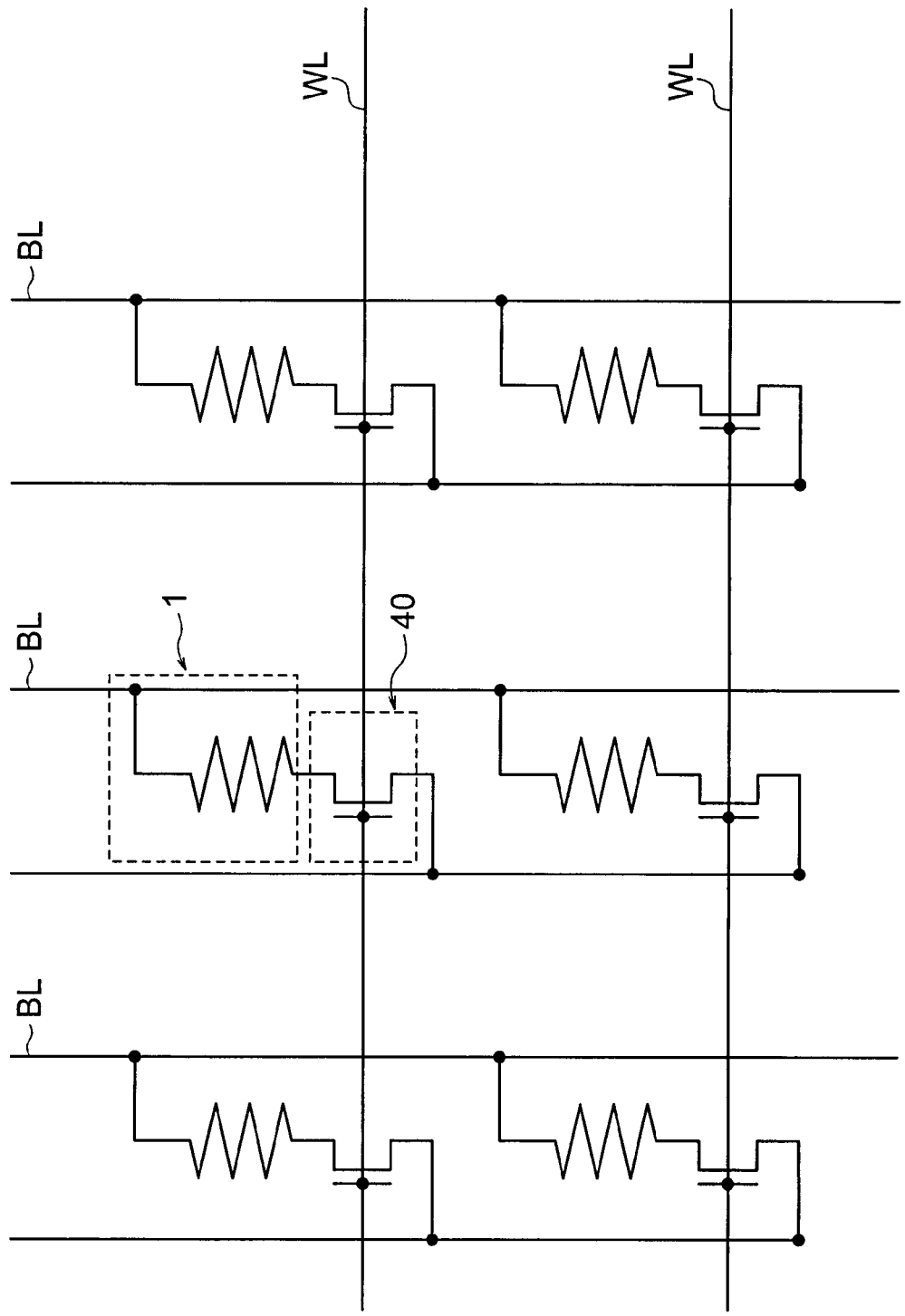
FIG. 9 is a circuit diagram of the spin-injection MRAM in accordance with the second embodiment.

FIG. 9 is a schematic circuit diagram of a spin-injection MRAM of this embodiment. Each memory cell having a MR element 1 and a select transistor 40 is arranged at an intersecting region of bit lines and word lines WL perpendicular to the bit lines BL. One end of the MR element 1 is connected to a bit line BL, and the other end of the MR element 1 is connected to one end of the select transistor 40. The other end of the select transistor 40 is connected to a first supply circuit (not shown) via a line. A word line WL is connected to the gate of the select transistor 40. One end of the bit line to which one end of the MR element 1 is connected to a second supply circuit (not shown), and the other end of the bit line is connected to a sense amplifier circuit (not shown).

Writing is performed by applying a current from the first supply circuit to the second supply circuit connected to the bit line BL via the select transistor 40 and the MR element 1, or applying a current in the opposite direction, so as to reverse the magnetization direction of the free layer of the MR element 1. Reading is performed by applying a current from one of the first and second supply circuits to the other in one direction, and the current is read out by the sense amplifier.

In the circuit diagram of FIG. 9, a desired MR element 1 is selected through the word lines WL and the bit lines BL that are perpendicular to each other, and information reading or writing is performed. Spin-injection writing can be performed with a current having a pulse width of several nanoseconds to several microseconds as the writing speed. For reading, the current pulse width should preferably be smaller than that for writing. With this arrangement, erroneous writing with the current for reading can be restrained.

As described so far, in accordance with each of the embodiments of the present invention, a high TMR ratio can be achieved with low areal resistance (RA), and information writing can be performed with a low current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc,
wherein current is applied between the magnetization pinned layer and the magnetization free layer through the intermediate layer, so that the magnetization of the magnetization free layer is reversible, and
wherein the intermediate layer has a NaCl crystalline structure.

2. The magnetoresistive effect element according to claim 1, wherein an interfacial layer containing boron (B) is formed at an interface between the intermediate layer and at least one of the magnetization free layer and the magnetization pinned layer.

3. The magnetoresistive effect element according to claim 1, wherein oxidized boron exists in an interfacial region between the intermediate layer and at least one of the magnetization free layer and the magnetization pinned layer.

4. The magnetoresistive effect element according to claim 1, wherein the magnetization pinned layer has a stacked structure comprising a first magnetic film, a nonmagnetic film, and a second magnetic film, the first and second magnetic films being antiferromagnetically coupled though the nonmagnetic film.

5. The magnetoresistive effect element according to claim 1, wherein the intermediate layer is an oxide containing boron (B) and magnesium (Mg).

6. A magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc,
wherein current is applied between the magnetization pinned layer and the magnetization free layer through the intermediate layer, so that the magnetization of the magnetization free layer is reversible, and
wherein a concentration peak of the boron in the intermediate layer is shifted to at least one of interfaces with the magnetization free layer and the magnetization pinned layer.

7. The magnetoresistive effect element according to claim 6, wherein the intermediate layer is an oxide containing boron (B) and magnesium (Mg).

8. A magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc,
wherein current is applied between the magnetization pinned layer and the magnetization free layer through the intermediate layer, so that the magnetization of the magnetization free layer is reversible, and
wherein the intermediate layer has a stacked structure comprising a first film and a second film with higher boron concentration than boron concentration in the first film.

9. The magnetoresistive effect element according to claim 8, wherein the intermediate layer is an oxide containing boron (B) and magnesium (Mg).

10. A magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc,
wherein current is applied between the magnetization pinned layer and the magnetization free layer through the intermediate layer, so that the magnetization of the magnetization free layer is reversible, and
wherein the intermediate layer has a stacked structure formed of a first film, a second film, and a third film, the second and third films sandwiching the first film and having higher boron concentration than boron concentration in the first film.

11. The magnetoresistive effect element according to claim 10, wherein the intermediate layer is an oxide containing boron (B) and magnesium (Mg).

12. A random access memory comprising:
memory cells,
each of the memory cells including a magnetoresistive effect element comprising:

a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc, wherein current is applied between the magnetization pinned layer and the magnetization free layer through the intermediate layer, so that the magnetization of the magnetization free layer is reversible, and wherein the intermediate layer has a NaCl crystalline structure.

13. The random access memory according to claim 12, wherein an interfacial layer containing boron (B) is formed at an interface between the intermediate layer and at least one of the magnetization free layer and the magnetization pinned layer.

14. The random access memory according to claim 12, wherein oxidized boron exists in an interfacial region between the intermediate layer and at least one of the magnetization free layer and the magnetization pinned layer.

15. The random access memory according to claim 12, wherein the magnetization pinned layer has a stacked structure comprising a first magnetic film, a nonmagnetic film, and a second magnetic film, the first and second magnetic films being antiferromagnetically coupled though the nonmagnetic film.

16. The random access memory according to claim 12, wherein the intermediate layer is an oxide containing boron (B) and magnesium (Mg).

17. A random access memory comprising:
memory cells,
each of the memory cells including a magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc,
wherein current is applied between the magnetization pinned layer and the magnetization free layer through the intermediate layer, so that the magnetization of the magnetization free layer is reversible, and
wherein a concentration peak of the boron in the intermediate layer is shifted to at least one of interfaces with the magnetization free layer and the magnetization pinned layer.

18. The random access memory according to claim 17, wherein the intermediate layer is an oxide containing boron (B) and magnesium (Mg).

19. A random access memory comprising:
memory cells,
each of the memory cells including a magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc,
wherein current is applied between the magnetization pinned layer and the magnetization free layer through the intermediate layer, so that the magnetization of the magnetization free layer is reversible, and
wherein the intermediate layer has a stacked structure comprising a first film and a second film with higher boron concentration than boron concentration in the first film.

20. The random access memory according to claim 19, wherein the intermediate layer is an oxide containing boron (B) and magnesium (Mg).

21. A random access memory comprising:
memory cells,
each of the memory cells including a magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and an element selected from the group consisting of Ca, Mg, Sr, Ba, Ti, and Sc,
wherein current is applied between the magnetization pinned layer and the magnetization free layer through the intermediate layer, so that the magnetization of the magnetization free layer is reversible, and
wherein the intermediate layer has a stacked structure comprising a first film, a second film, and a third film, the second and third films sandwiching the first film and having higher boron concentration than boron concentration in the first film.

22. The random access memory according to claim 21, wherein the intermediate layer is an oxide containing boron (B) and magnesium (Mg).

23. A magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and magnesium (Mg),
wherein current is applied between the magnetization pinned layer and the magnetization free layer through the intermediate layer, so that the magnetization of the magnetization free layer is reversible, and
wherein an interfacial layer containing boron (B) is formed at an interface between the intermediate layer and at least one of the magnetization free layer and the magnetization pinned layer.

24. A magnetoresistive effect element comprising:
a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and magnesium (Mg),
wherein current is applied between the magnetization pinned layer and the magnetization free layer through the intermediate layer, so that the magnetization of the magnetization free layer is reversible, and wherein oxidized boron exists in an interfacial region between the intermediate layer and at least one of the magnetization free layer and the magnetization pinned layer.

25. A random access memory comprising:

memory cells, each of the memory cells including a magnetoresistive effect element comprising:

a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and magnesium (Mg), wherein current is applied between the magnetization pinned layer and the magnetization free layer through the intermediate layer, so that the magnetization of the magnetization free layer is reversible, and wherein an interfacial layer containing boron (B) is formed at an interface between the intermediate layer and at least one of the magnetization free layer and the magnetization pinned layer.

26. A random access memory comprising:

memory cells, each of the memory cells including a magnetoresistive effect element comprising:

a film stack that includes a magnetization free layer comprising a magnetic layer in which magnetization direction is changeable, a magnetization pinned layer comprising a magnetic layer in which magnetization direction is pinned, and an intermediate layer provided between the magnetization free layer and the magnetization pinned layer, the intermediate layer being an oxide containing boron (B) and magnesium (Mg), wherein current is applied between the magnetization pinned layer and the magnetization free layer through the intermediate layer, so that the magnetization of the magnetization free layer is reversible, and wherein oxidized boron exists in an interfacial region between the intermediate layer and at least one of the magnetization free layer and the magnetization pinned layer.

* * * * *